United States Patent
Brenner et al.

(10) Patent No.: US 9,989,442 B2
(45) Date of Patent: Jun. 5, 2018

(54) HYDRAULIC SYSTEM SENSOR

(71) Applicant: Eaton Intelligent Power Limited, Dublin (IE)

(72) Inventors: Paul Brenner, Chaska, MN (US); Hassan Al-Atat, Lakeville, MN (US); David Makis, Shakopee, MN (US)

(73) Assignee: Eaton Intelligent Power Limited, Dublin (IE)

( * ) Notice: Subject to any disclaimer, the term of this patent is extended or adjusted under 35 U.S.C. 154(b) by 55 days.

(21) Appl. No.: 15/027,057

(22) PCT Filed: Oct. 2, 2014

(86) PCT No.: PCT/US2014/058894
§ 371 (c)(1),
(2) Date: Apr. 4, 2016

(87) PCT Pub. No.: WO2015/051172
PCT Pub. Date: Apr. 9, 2015

(65) Prior Publication Data
US 2016/0238489 A1      Aug. 18, 2016

Related U.S. Application Data

(60) Provisional application No. 61/885,796, filed on Oct. 2, 2013.

(51) Int. Cl.
*G01M 99/00* (2011.01)
*H02N 2/18* (2006.01)
(Continued)

(52) U.S. Cl.
CPC ....... *G01M 99/005* (2013.01); *B66F 9/07572* (2013.01); *F15B 19/005* (2013.01);
(Continued)

(58) Field of Classification Search
CPC ................ B66F 9/07572; F15B 19/005; F15B 2211/6306; F15B 2211/6343;
(Continued)

(56) References Cited

U.S. PATENT DOCUMENTS

2008/0083445 A1* 4/2008 Chakraborty ........... H01L 35/30
136/205
2009/0195222 A1* 8/2009 Lu .......................... H02N 2/188
322/3

(Continued)

OTHER PUBLICATIONS

International Search Report for corresponding International Patent Application No. PCT/US2014/058894 dated Jan. 28, 2015.

*Primary Examiner* — Francis Gray
(74) *Attorney, Agent, or Firm* — Merchant & Gould P.C.

(57) ABSTRACT

A hydraulic system includes a hydraulic circuit and a sensor for sensing a characteristic of hydraulic fluid of the hydraulic circuit. An energy harvester is configured to harvest energy from the hydraulic circuit. A controller interfaces with the sensor and is powered at least in part by the energy harvester. Various types of sensors are employed, including pressure and temperature sensors. A battery may further be included for powering the controller in addition to the energy harvester.

22 Claims, 5 Drawing Sheets

(51) Int. Cl.
  *H01L 35/30* (2006.01)
  *F15B 19/00* (2006.01)
  *B66F 9/075* (2006.01)
  *G01L 1/24* (2006.01)
  *G01K 7/02* (2006.01)
  *G01L 19/00* (2006.01)
  *G01L 19/08* (2006.01)
  *G01D 21/00* (2006.01)
  *G01K 13/02* (2006.01)

(52) U.S. Cl.
  CPC ............... *G01K 7/02* (2013.01); *G01L 1/246* (2013.01); *G01L 19/0092* (2013.01); *H01L 35/30* (2013.01); *H02N 2/185* (2013.01); *F15B 2211/6306* (2013.01); *F15B 2211/6343* (2013.01); *G01D 21/00* (2013.01); *G01K 2013/026* (2013.01); *G01L 19/08* (2013.01)

(58) Field of Classification Search
  CPC .... G01D 21/00; G01K 2013/026; G01K 7/02; G01L 19/0092; G01L 19/08; G01L 1/246; H01L 35/30; H02N 2/185
  See application file for complete search history.

(56) References Cited

U.S. PATENT DOCUMENTS

| | | | |
|---|---|---|---|
| 2010/0174495 A1* | 7/2010 | Pereira | F16L 11/127 |
| | | | 702/34 |
| 2011/0226302 A1 | 9/2011 | Farmer et al. | |
| 2012/0019214 A1 | 1/2012 | Hussain | |
| 2012/0025531 A1* | 2/2012 | Montgomery | F03B 13/20 |
| | | | 290/53 |
| 2012/0133210 A1* | 5/2012 | Moon | H01L 35/00 |
| | | | 307/80 |
| 2012/0204923 A1 | 8/2012 | Ortiz et al. | |
| 2014/0319970 A1* | 10/2014 | Sherrit | H02N 2/185 |
| | | | 310/339 |

* cited by examiner

HYDRAULIC SYSTEM SENSOR

CROSS-REFERENCE TO RELATED APPLICATION(S)

This application is being filed on Oct. 2, 2014, as a PCT International Patent application and claims priority to U.S. Patent Application Ser. No. 61/885,796 filed on Oct. 2, 2013, the disclosure of which is incorporated herein by reference in its entirety.

BACKGROUND

The present disclosure relates generally to hydraulic systems. Hydraulic systems include various hydraulic components such as pumps, motors, valves, actuators, hoses, etc., and a pressurized medium (liquid or gas) flows between components. These components are typically connected together and often operate in remote areas. The hydraulic components can be prone to degradation and failures over time. It is therefore desirable to monitor the health and performance of the various hydraulic components and/or the system as a whole. Diagnostic and condition monitoring for the different hydraulic components can include, for example, model-based diagnostics, data-driven diagnostics, and a hybrid between data-driven and model-based diagnostics. Sensors (pressure, temperature, etc.) are sometimes provided in the hydraulic system to provide real-time measurements of various aspects of the hydraulic system to facilitate such diagnostic and condition monitoring.

Improvements in hydraulic system sensors are desired.

SUMMARY

In accordance with aspects of the present disclosure, a hydraulic system includes a hydraulic circuit and a sensor for sensing a characteristic of hydraulic fluid of the hydraulic circuit. Such sensing can facilitate monitoring various characteristics of hydraulic components and/or a hydraulic system signature. An energy harvester is configured to harvest energy from the hydraulic circuit. A controller interfaces with the sensor and is powered at least in part by the energy harvester. Various types of sensors are employed, including pressure and temperature sensors. A battery may further be included for powering the controller in addition to the energy harvester. In some embodiments, the battery is a rechargeable battery that can be recharged by the energy harvester. Different types of energy harvesters employed include thermoelectric and piezoelectric energy harvesters, for example.

In accordance with further aspects of the disclosure, a sensor module for sensing a characteristic of a hydraulic system includes a module body with an inlet and an outlet. A fluid flow path extends between the inlet and the outlet, and a sensor is situated in fluid communication with the fluid flow path. An energy harvester is connected to the module body and configured to harvest energy from the hydraulic system. A controller interfaces with the sensor and is powered at least in part by the energy harvester.

In accordance with still further aspects of the disclosure, a method of sensing a characteristic of hydraulic fluid includes providing a hydraulic circuit and sensing a characteristic of the hydraulic fluid with a sensor situated in the hydraulic circuit. An output of the sensor is provided to a controller, and energy from the hydraulic circuit is harvested to power the controller.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as top, bottom, front, back, etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense.

In general, this disclosure relates to sensors for hydraulic systems. Hydraulic systems often operate in harsh environmental conditions and thus, the hydraulic components can be prone to degradation and failures over time. It is therefore desirable to provide a sensor system for monitoring the health and performance of the various hydraulic components and/or the system as a whole. Diagnostic and condition monitoring for the different hydraulic components can include, for example, model-based diagnostics, data-driven diagnostics, and a hybrid between data-driven and model-based diagnostics. Central to those three approaches is access to real-time measurements for various aspects of the hydraulic system, such as pressure, temperature, etc. However, integrating measurement devices such as sensors into the hydraulic components for obtaining this information can be difficult. Further, since such systems are often used in remote mobile and/or stationary settings, powering the sensors can be problematic.

Figure 1:
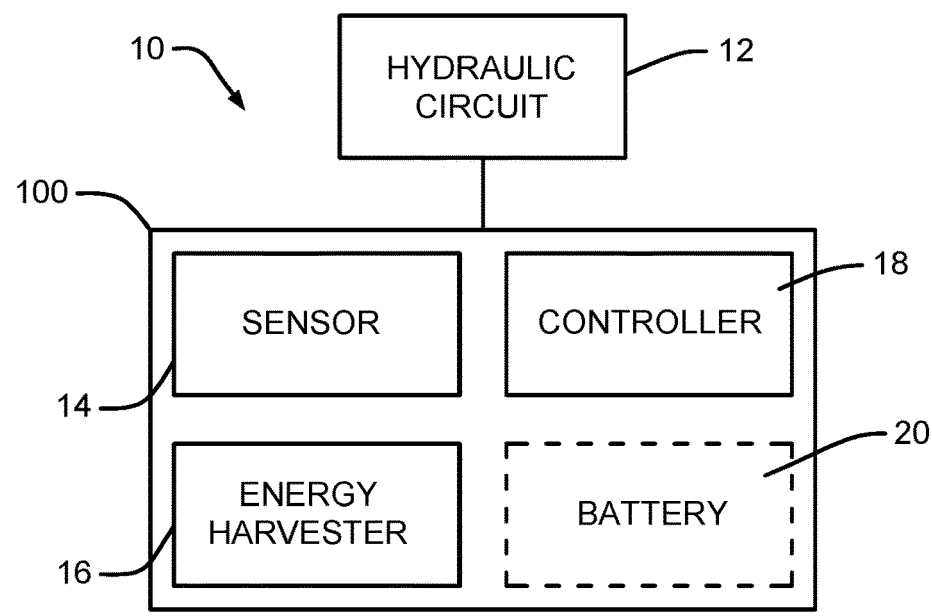
FIG. 1 is a block diagram conceptually illustrating an example a hydraulic system in accordance with aspects of the present disclosure.

FIG. 1 conceptually illustrates an example of hydraulic system 10 that is configured to monitor hydraulic system parameters and collect data that can be used for diagnostic purposes. Information obtained by the sensor can be used for monitoring a characteristic component or hydraulic system signature. The system 10 includes a hydraulic circuit 12 that has various hydraulic components, and a sensor 14 for sensing a characteristic of hydraulic fluid of the hydraulic circuit 12. An energy harvester 16 is configured to harvest energy from the hydraulic circuit 12, and a controller 18 is powered at least in part by the energy harvester 16. The controller 18 interfaces with the sensor 14 to receive data regarding the hydraulic circuit 12 therefrom, and in some implementations is programmed to manage power from the energy harvester 14 for powering the controller 18 and sensor 14, and also to perform diagnostics on the system 10 based on data received from the sensor 14. For example, the controller 18 can monitor a component and/or a system signature of the hydraulic system 10 based on data received from the sensor 14.

In some examples, a sensor module 100 is provided that allows access to the hydraulic circuit 12 and the hydraulic fluid that flows between different hydraulic components that make up the hydraulic circuit 12. For example, the sensor module 100 could contain the sensor 14, energy harvester 16, and controller 18 to provide a portable, scalable interface to a hydraulic circuit 12. A battery 20 may further be provided for use at start up or other times when harvested energy is low. In some embodiments, the battery 20 is a rechargeable battery that is charged by the energy harvester 16.

Figure 2:
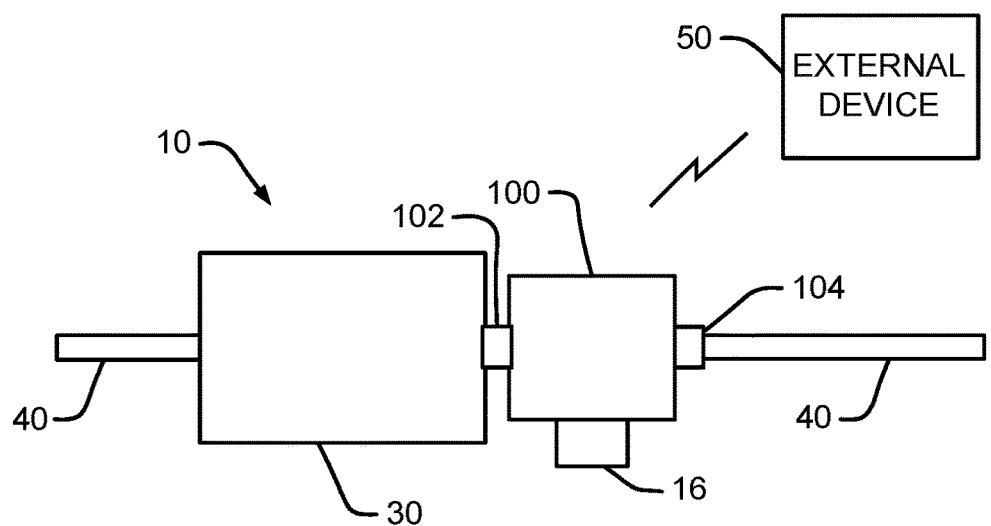
FIG. 2 is a block diagram conceptually illustrating further aspects of the hydraulic system shown in FIG. 1.

FIG. 2 illustrates further aspects of an example hydraulic system 10 in accordance with the present disclosure. In FIG. 2, a first connection port 102 (inlet) of the sensor module 100 is connected to a hydraulic component 30, such as a hydraulic pump, motor, valve, etc. of the hydraulic circuit 12. A second connection port 104 (outlet) of the sensor module 100 is connected to a hydraulic hose 40. In certain embodiments, the inlet and outlet 102,104 are threaded or configured with other standard hydraulic connections and can be any appropriate size (e.g. dash 20, 16, 12, etc.) and configuration for connection to other hydraulic components. It should be noted that the first and second connection ports 102,104 could be either an inlet or an outlet, and these designations can change depending on whether the component is capable of uni-directional or bi-directional flow.

The controller 18 interacts with the sensor 14 and energy harvester 16 for power storage and consumption (sensing, processing, communicating etc.). In some examples, the controller 18 also manages the power harvested from the energy harvesters 16 to power the controller 18 and the sensor 14. The controller 18 receives data output by the sensor 14 data, processes the data, and communicates with one or more external devices 50 (typically wirelessly) such as a data aggregating system or a separate system level controller that will allow electrohydraulic components within the hydraulic system 10 to be controlled or cycled in a specific manner such that system health can be evaluated. For instance, the controller 18 and/or external devices 50 can be configured so as to compare a measured component or system signature against a predefined component or system signature (typically stored in a memory) that is representative of acceptable levels of performance and/or health.

Figure 3:
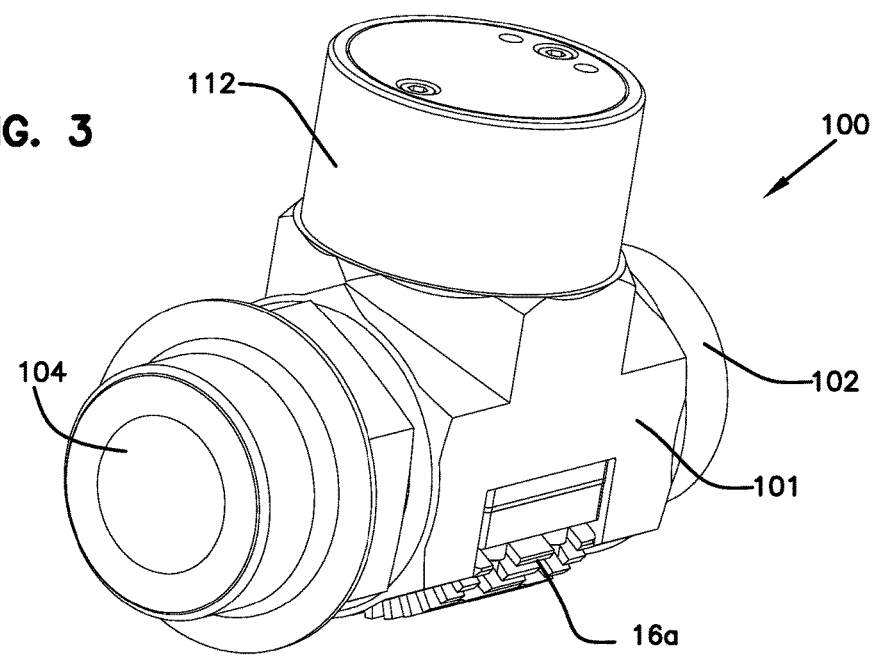
FIG. 3 is a perspective view illustrating an example of a sensor module in accordance with aspects of the present disclosure.
Figure 4:
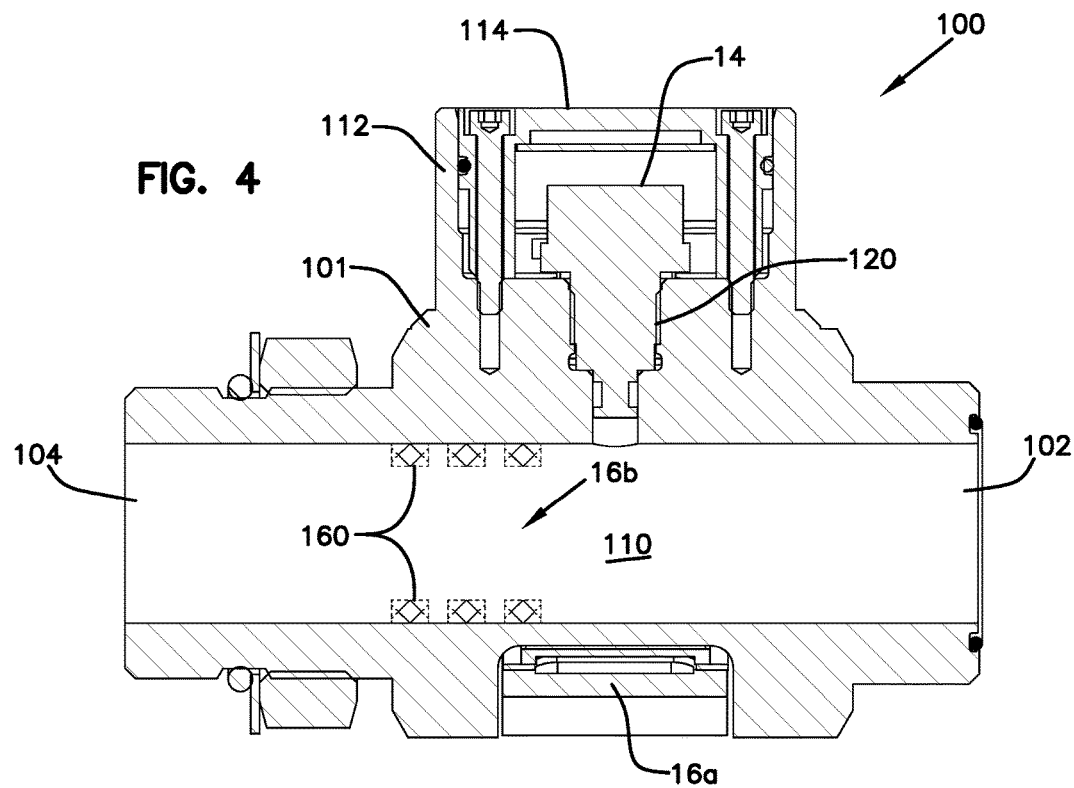
FIG. 4 is a sectional side view of the sensor module shown in FIG. 3.
Figure 5:
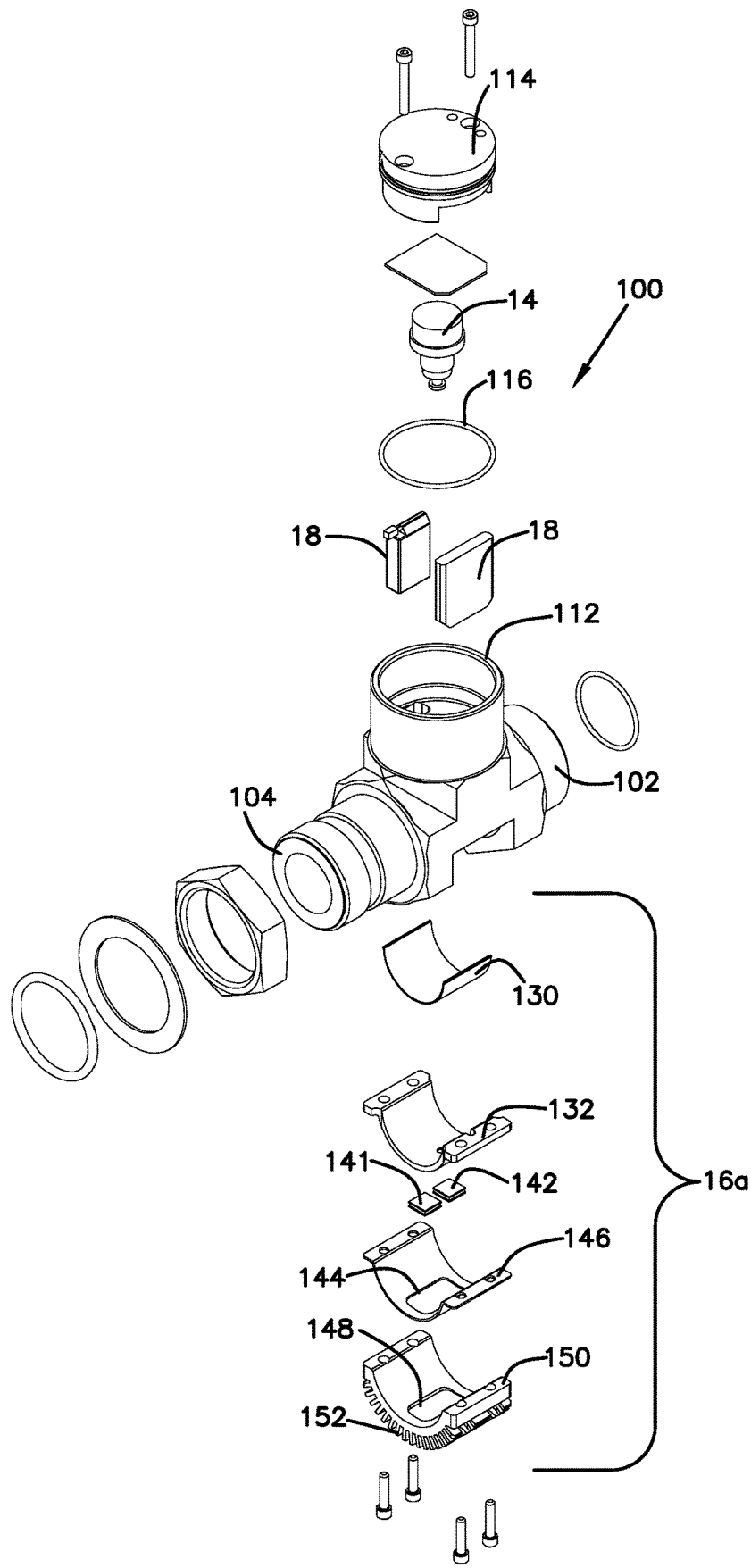
FIG. 5 is an exploded perspective view of the sensor module shown in FIGS. 3 and 4.

FIGS. 3-5 illustrate aspects of an example sensor module 100. Implementations of the disclosed sensor module 100 are portable and modular in that different styles and connection sizes can be provided, different form factors, etc. The embodiment illustrated in FIGS. 3-5 includes a module body 101 having two connection ports—an inlet 102 and an outlet 104 with a fluid flow path 110 therebetween. The sensor 14 is situated in fluid communication with the fluid flow path 110, and the energy harvester 16 is connected to the module body 101 to harvest energy from the hydraulic system 10.

The sensor module 100 illustrated in FIGS. 3-5 has an in-line or linear flow path 110, in that fluid flows from the inlet 102 to the outlet 104 in essentially a straight line. Other configurations are also possible, such as elbow (90° or 45° bend, for example), T-shaped, etc. A top portion of the module 100 includes a component housing 112 that defines an opening 120 for receiving the sensor 14. The sensor 14 is positioned such that a lower portion is in fluid contact with the flow path 110 to measure characteristic of fluid flowing therethrough, which could be either in liquid or gas form. Various types of sensors are used in different embodiments. For example, the sensor 14 can include pressure and/or temperature sensors. The controller 18 and battery 20 are also situated in the component housing 112. The component housing 112 is closed and sealed by a cover 114 and O-ring 116. In some embodiments, the cover 114 includes an integrated antenna that is used for wireless communications with the external device 50.

In the embodiment shown in FIGS. 3-5, the energy harvester 16 includes a thermoelectric energy harvester 16a that is connected to a bottom surface of the module body 101. Referring to FIG. 5, the thermoelectric energy harvester 16a includes an inner adapter 130 that contacts the module body 101 and conducts heat generated by hydraulic fluid flowing in the flow path 110 to a first mounting plate 132 that is situated over the inner adapter 130. First and second thermoelectric generator devices 140,142 are in contact with the first mounting plate 132, and extend through an opening 144 in a seal 146. The seal 146 is an insulating or non-thermal conducting component. The devices 140,142 are received in a mounting opening 148 of an outer adapter 150.

The outer adapter 150 includes a plurality of cooling fins 152 that help cool the outer adapter. Thus, a temperature gradient is created when the hydraulic fluid flowing through the flow path 110 heats the module body 101, and thus the inner adapter 130 and first mounting plate 132 on one side of the thermoelectric generator devices 141, 142. The opposite sides of the thermoelectric generator devices 141, 142 are in contact with seal 146 and the cooler outer adapter 150. The thermoelectric generator devices 141, 142 generate energy based on this temperature difference.

In other embodiments, energy is harvested using piezoelectric devices in place of or in addition to the thermoelectric energy harvester 16a. For example, FIG. 3 conceptually illustrates aspects of a piezoelectric energy harvester 16b that includes piezoelectric rings 160 situated in the flow path 110 of the module body 101. Hydraulic fluid flowing through the flow path 110 will exert pressure pulsations on the inner walls of the module body 101, and thus the piezoelectric rings 160 situated in the flow path 110. The pressure pulsation amplitude and frequency exerted will depend on the particular hydraulic application. Energy is harvested by the piezoelectric devices 160 in response to the hydraulic fluid pressure pulsation amplitude and frequency.

Figure 6:
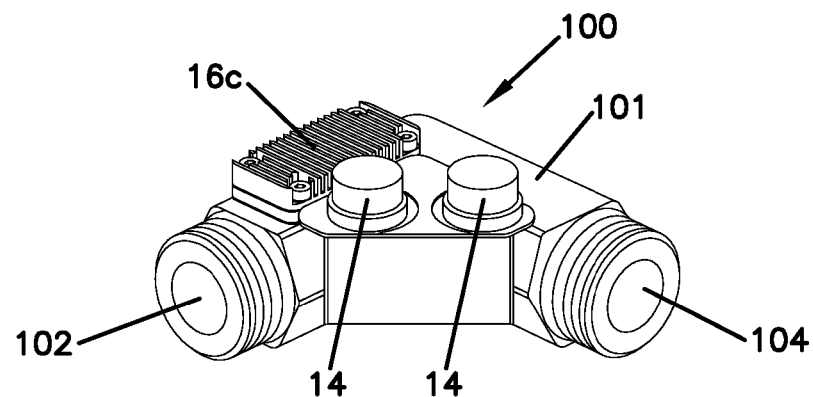
FIG. 6 is a perspective view of another example of a sensor module in accordance with the present disclosure.
Figure 7:
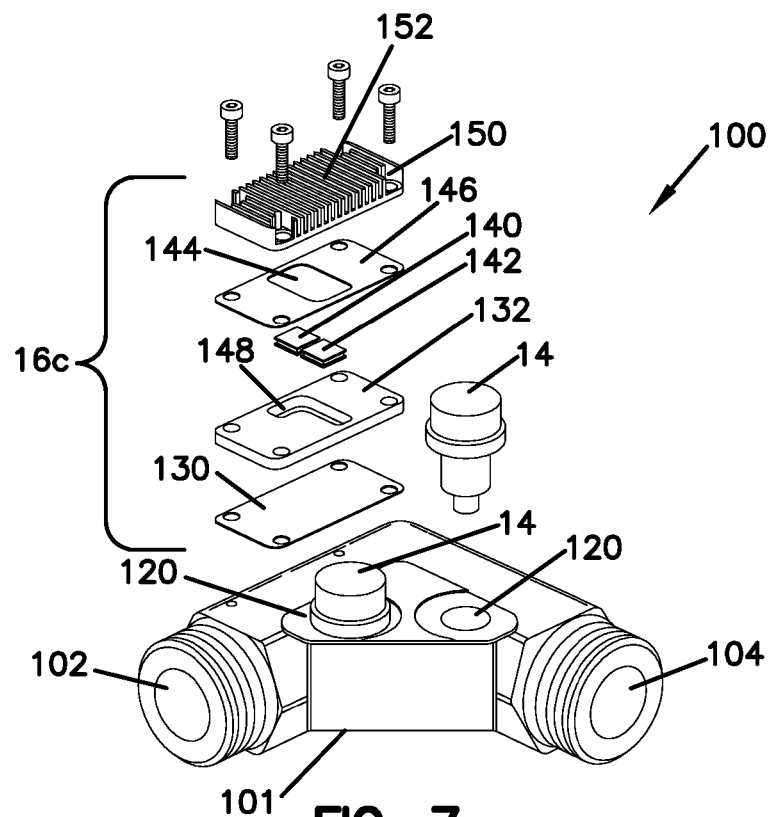
FIG. 7 is an exploded perspective view of the sensor module shown in FIG. 6.

FIGS. 6 and 7 illustrate an example of another sensor module 100, in which the flow path 110 defines a 90° bend. The example illustrated in FIGS. 6 and 7 includes a module body 101 with the fluid inlet 102 and fluid outlet 104 oriented to define an angle of about 90°. Two sensors 14 are spaced apart and situated in fluid communication with the fluid flow path 110, and are also situated to be about 90° apart from one another. The module body 101 defines two openings 120 for receiving the sensors 14. The sensors 14 each are positioned such that a lower portion is in fluid contact with the flow path 110 and the hydraulic fluid flowing therethrough. In the version shown in FIGS. 6 and 7, the sensors 14 are pressure sensors. Temperature sensors may further be included. By placing the pressure sensors 14 in respective legs of the 90° bend, fluid flow can be calculated based on the difference of the pressure measurements of the two sensors 14 using the temperature element of the sensor to compensate for variations in the fluid or gaseous medium in a predefined condition.

A thermoelectric energy harvester 16c is arranged similarly to that shown in FIG. 5, though rather than being curved as shown in FIG. 5, the thermoelectric energy harvester 16c shown in FIGS. 6 and 7 is arranged on a flat portion of the module body 101. The thermoelectric energy harvester 16c shown in FIG. 7 includes a flat inner adapter 130 that contacts the module body 101 and conducts heat generated by hydraulic fluid flowing in the flow path 110 to a first mounting plate 132 that is situated over the inner adapter 130. First and second thermoelectric generator devices 140,142 are received in the mounting opening 148 defined by the first mounting plate 132, and extend through an opening 144 in an insulator or non-thermal conducting seal 146. An outer adapter 150 is situated over the second mounting plate 146 and includes a plurality of cooling fins 152 that help cool the outer adapter 150. Thus, as with the thermoelectric energy harvester 16a disclosed in conjunction with FIGS. 3-5, a temperature gradient is created when the hydraulic fluid flowing through the flow path 110 heats the module body 101, and thus the inner adapter 130 and first mounting plate 132 on one side of the thermoelectric generator devices 141, 142. The opposite sides of the thermoelectric generator devices 141, 142 are in contact with the cooler outer adapter 150. The thermoelectric generator devices 141, 142 generate energy based on this temperature difference.

As noted above, various combinations of energy harvesters 16 (thermoelectric, piezoelectric, etc.) with or without batteries 20 can be used for powering the controller 18 and or/sensor 14. Some examples are listed as follows.

Thermoelectric harvester+rechargeable battery: The harvested energy from the thermoelectric harvester is channeled into a small rechargeable battery. The controller 18 manages the charging of the battery. This configuration allows the controller 18 to operate using battery power when the harvested power is low or none.

Piezoelectric harvester+rechargeable battery: Similar to previous configuration but with a piezoelectric harvester instead of a thermoelectric harvester.

Thermoelectric harvester+piezoelectric harvester+rechargeable battery: The above two configurations combined, where the controller 18 uses power from both harvesters 16 to charge the battery 20.

Piezoelectric and/or thermoelectric harvester with non-rechargeable battery: In this configuration the battery 20 is non-rechargeable, so the controller 18 uses any energy harvested first to power its operation and complement it when needed by drawing energy from the non-rechargeable battery 20. The energy harvester 16 extends the life of the non-rechargeable battery since it is used only when the energy harvester 16 is unable to provide adequate power to the controller 18 and/or sensor 14.

Piezoelectric and/or thermoelectric harvester directly: In this configuration no battery is used. The sensor 14 and controller 18 are in deep sleep mode whenever there is no harvested energy, and wake up to operate whenever any energy is harvested.

Figure 8:
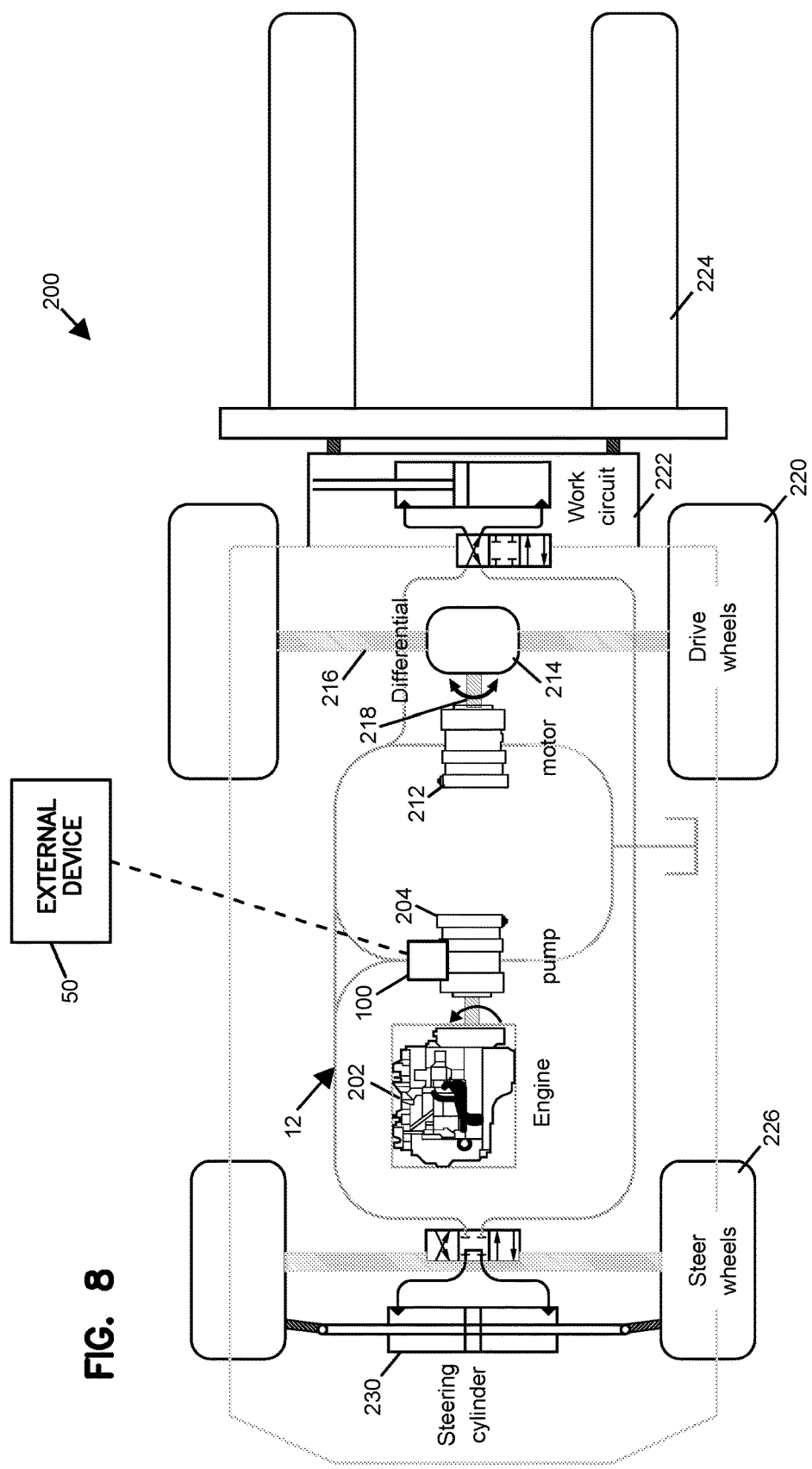
FIG. 8 is a schematic diagram conceptually illustrating an example of a work machine employing a sensor module in accordance with the present disclosure.

FIG. 8 schematically illustrates an example of a hydraulic system including a hydraulic circuit 12 employed in a work machine 200. In the illustrated example, the work machine 200 is a fork lift though any type of machine employing a hydraulic circuit could be employed. The machine 200 includes an engine 202 that drives a hydraulic pump 204. The pump 204 has a sensor module 100 in accordance with aspects of the present disclosure coupled thereto to monitor aspects of the pump 204 and the hydraulic circuit 12 in general. The pump 204 is connected to various hydraulic components of the machine 200 by appropriate fluid conveyance components which in turn allow the fluid medium to circulate through the hydraulic circuit 12 from a fluid reservoir 210. For instance, the hydraulic pump is in fluid connection with a motor 212 that is connected to a differential 214 to drive a pair of drive wheels 220 via an axle 216. The hydraulic pump 204 is also connected to a hydraulic work circuit 222 that is operable to move the forks 224 of the fork lift 200 as desired by an operator. A hydraulic steering cylinder 230 is in fluid connection with the hydraulic pump 204 to operate a pair of steer wheels 226.

As noted above, the sensor module 100 includes a controller 18 (see FIG. 1) that is powered at least in part by the energy harvester 16. In some embodiments, the controller 18 situated in the module 100 is configured to store a signature of the hydraulic pump 204, including characteristic parameters of the pump 204 such as hydraulic fluid pressure, pumping ripple, pressure rise rate, temperature, flow, etc. When the machine 200 and thus the pump 204 are operating, the controller 18 receives measurements from the sensor 14 and compares these measurements to the stored signature, wherein deviations from the stored signature can indicate problems with the pump 202. Further, the controller 18 of the module 100 is configured to communicate wirelessly with an external device 50, such as an external controller, that may be configured to store and monitor additional parameters of the various hydraulic components of the machine 200. Data received from the controller 18 (and from controllers of other sensor modules associated with other hydraulic components), the system health of the entire machine 200 can be monitored.

The above specification, examples and data provide a complete description of the manufacture and use of the composition of the invention. Since many embodiments of the invention can be made without departing from the spirit and scope of the invention, the invention resides in the claims hereinafter appended.

What is claimed is:
1. A hydraulic system, comprising:
a hydraulic circuit;
a module body connected to the hydraulic circuit, the module body having an inlet and an outlet with a fluid flow path between the inlet and the outlet;
a sensor connected to the module body for sensing a characteristic of hydraulic fluid of the hydraulic circuit;
an energy harvester configured to harvest energy from the hydraulic circuit; and
a controller powered at least in part by the energy harvester, the controller interfacing with the sensor.
2. The hydraulic system of claim 1, wherein the sensor includes a temperature sensor.
3. The hydraulic system of claim 1, wherein the sensor includes a pressure sensor.
4. The hydraulic system of claim 1, further comprising a battery for powering the controller.
5. The hydraulic system of claim 4, wherein the battery is a rechargeable battery, and wherein the rechargeable battery is recharged by the energy harvester.
6. The hydraulic system of claim 1, wherein the energy harvester includes a thermoelectric generator configured to generate power in response to heat generated by the hydraulic fluid.
7. The hydraulic system of claim 1, wherein the energy harvester includes a piezoelectric device configured to gen- erate power in response to pressure exerted on the piezoelectric device by the hydraulic fluid.

8. The hydraulic system of claim 1, wherein the controller is configured to compare a sensed characteristic with a stored characteristic.

9. The hydraulic system of claim 1, wherein the controller is configured to monitor a component of the hydraulic system based on data received from the sensor.

10. The hydraulic system of claim 1, wherein the controller is configured to monitor a system signature based on data received from the sensor.

11. The hydraulic system of claim 1, wherein the controller is configured to communicate with an external device.

12. A sensor module for sensing a characteristic of a hydraulic system, comprising:
   a module body having an inlet and an outlet with a fluid flow path between the inlet and the outlet;
   a sensor situated in fluid communication with the fluid flow path;
   an energy harvester connected to the module body and configured to harvest energy from the hydraulic system; and
   a controller powered at least in part by the energy harvester, the controller interfacing with the sensor.

13. The sensor module of claim 12, wherein the sensor includes a temperature sensor.

14. The sensor module of claim 12, wherein the sensor includes a pressure sensor.

15. The sensor module of claim 14, wherein the sensor includes first and second pressure sensors spaced apart from one another.

16. The sensor module of claim 12, further comprising a battery for powering the controller.

17. The sensor module of claim 12, wherein the energy harvester includes a piezoelectric device situated in the fluid flow path.

18. The sensor module of claim 12, wherein the energy harvester includes a thermoelectric generator situated on an outside surface of the module body.

19. The sensor module of claim 12, wherein the inlet is coupled to a hydraulic component and the outlet is coupled to a hydraulic hose.

20. The sensor module of claim 19, wherein the hydraulic component is a component of a hydraulic work machine.

21. The sensor module of claim 12, wherein the sensor is configured to measure a characteristic of a liquid flowing through the fluid flow path.

22. The sensor module of claim 12, wherein the sensor is configured to measure a characteristic of a gas flowing through the fluid flow path.

* * * * *